United States Patent [19]
Sher

[11] Patent Number: 5,793,224
[45] Date of Patent: Aug. 11, 1998

[54] VOLTAGE GENERATOR FOR ANTIFUSE PROGRAMMING

[75] Inventor: Joseph C. Sher, Boise, Id.

[73] Assignee: Micron Technology, Inc., Boise, Id.

[21] Appl. No.: 666,617

[22] Filed: Jun. 18, 1996

[51] Int. Cl.$^6$ .................................................. H03K 3/354
[52] U.S. Cl. ........................ 326/38; 327/537; 365/225.7
[58] Field of Search ...................... 365/225.7; 327/525, 327/537; 326/32–39; 323/311

[56] References Cited

U.S. PATENT DOCUMENTS

| | | | |
|---|---|---|---|
| 5,294,846 | 3/1994 | Paivinen | 327/525 X |
| 5,469,379 | 11/1995 | Levy | 365/225.7 X |
| 5,495,436 | 2/1996 | Callahan | 365/225.7 X |
| 5,521,547 | 5/1996 | Tsukada | 327/537 |
| 5,544,070 | 8/1996 | Cox et al. | 326/38 X |
| 5,546,044 | 8/1996 | Calligaro et al. | 327/537 X |
| 5,561,385 | 10/1996 | Choi | 327/537 X |

Primary Examiner—David R. Hudspeth
Attorney, Agent, or Firm—Fletcher & Associates

[57] ABSTRACT

Circuitry in an integrated circuit for programming an antifuse element is disclosed. In one embodiment, oscillating voltages are produced at two nodes, and these voltages are approximately 180° out of phase with one another. In another embodiment, an oscillating voltage is produced at one node and a negative voltage is produced at a second node. In each embodiment, the maximum difference in voltage between the two nodes is sufficient to program an antifuse element.

18 Claims, 4 Drawing Sheets

VOLTAGE GENERATOR FOR ANTIFUSE PROGRAMMING

BACKGROUND OF THE INVENTION

1. Field of the Invention

The present invention relates to circuitry for programming antifuse elements in integrated circuit products.

2. Description of the Prior Art

Contemporary dynamic random access memory ("DRAM") products require a high degree of redundancy in order to improve manufacturing yields. Present redundancy techniques in DRAMs include providing extra memory array columns and/or extra memory array rows which can be used to replace defective columns and/or rows. Antifuses have been used as nonvolatile programmable memory elements to store logic states which would be used in DRAMs for row and column redundancy implementation.

An antifuse is a two-terminal, one time programmable device which functions as an open circuit until programmed. Ideal programming would result in a short circuit between the two terminals; however, programming usually results in a relatively small resistance existing between the two terminals. Antifuses for redundancy implementation are usually constructed in the same manner as the memory cell capacitors in the DRAM array.

Antifuses have other uses in integrated circuit products besides redundancy implementation. Antifuses may, for example, be used in an integrated circuit product as a mechanism for changing the operating mode of the product. Likewise, antifuses may be programmed to encode identification information about the integrated circuit, e.g., when it was fabricated.

An antifuse element may be programmed by providing a voltage of approximately 10 volts across the terminals of the device. In DRAM products, for example, a programming voltage of that magnitude typically has been provided to the memory via an external pin. Since this externally-applied voltage is higher in magnitude than the normal supply voltage $V_{CC}$ to the memory, certain problems are created by this approach.

First, the tester that is used to check out the memory product must be capable of providing these higher programming voltages. Second, electrostatic detection (ESD) circuitry on the chip must be modified for the programming voltage, and in doing so, ESD sensitivity may be adversely affected in that the ESD circuits may latch up. The present invention eliminates the need for different ESD structures on a DRAM.

SUMMARY OF THE INVENTION

In accordance with the present invention, circuitry is provided in an integrated circuit to generate a voltage for programming antifuses.

In one embodiment, the voltage generator of the present invention comprises circuitry that produces two oscillating voltages at two nodes, which voltages are 180° out of phase with one another. The maximum difference in voltage between these two nodes is sufficient to program an antifuse element.

In another embodiment, the voltage generator of the present invention comprises circuitry that produces an oscillating voltage at one node and a constant negative voltage at a second node. The maximum difference in voltage between these two nodes is sufficient to program an antifuse element.

DESCRIPTION OF SPECIFIC EMBODIMENTS

It will be appreciated that the present invention can take many forms and embodiments. Some embodiments of the invention are described so as to give an understanding of the invention. It is not intended, however, for these embodiments to limit the invention.

Figure 1:
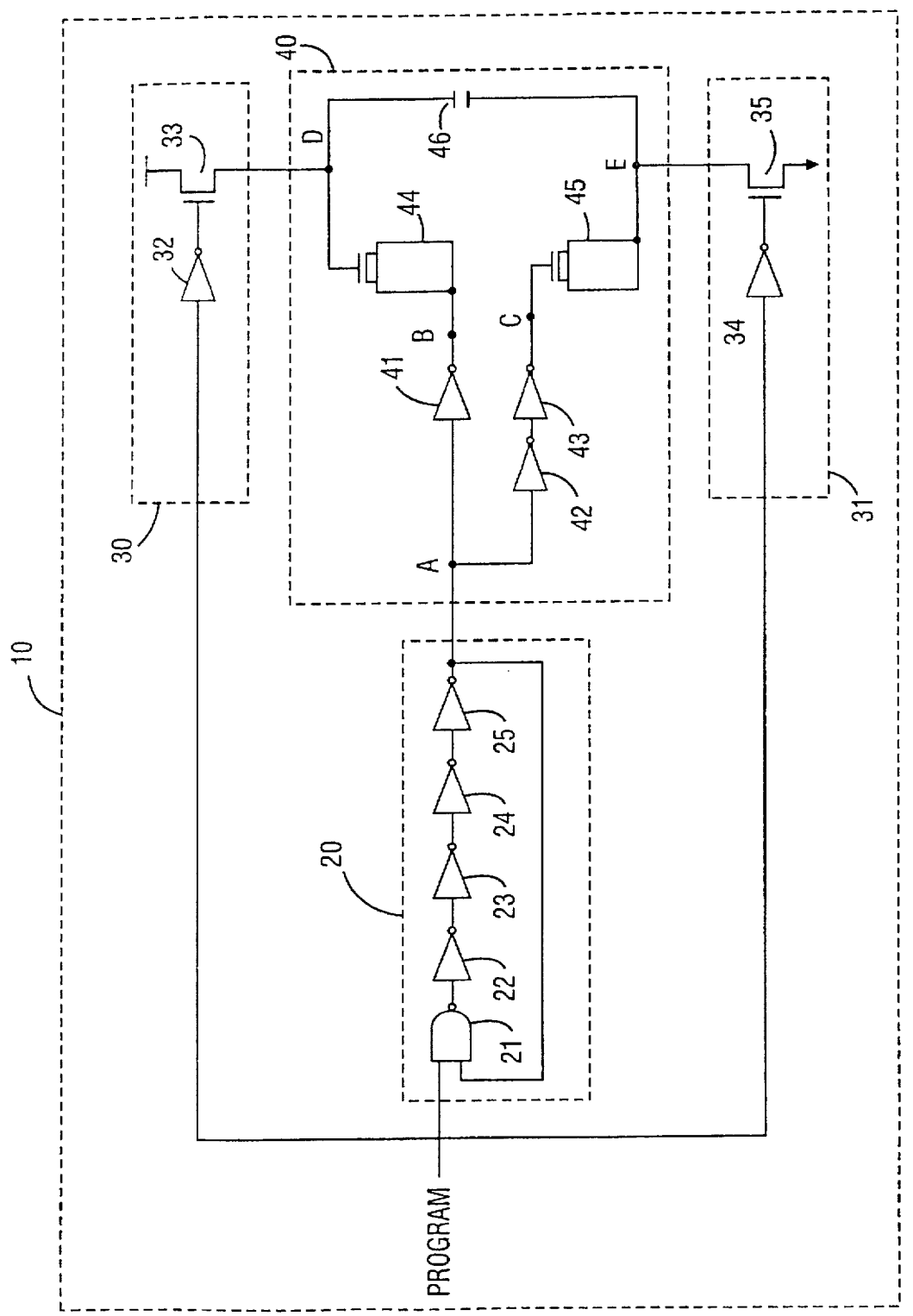
FIG. 1 is an electrical schematic diagram that illustrates one embodiment of a voltage generator in accordance with the present invention.

With reference first to FIG. 1, there is shown an integrated circuit 10, e.g., a DRAM, incorporating one embodiment of a voltage generator in accordance with the present invention. This embodiment includes oscillator 20, precharge circuits 30 and 31, and programming circuitry 40, all connected as shown in FIG. 1. Oscillator 20 is preferably a ring oscillator including NAND gate 21 and inverters 22–25. Precharge circuit 30 includes inverter 32 and N-channel transistor 33, while precharge circuit 31 includes inverter 34 and N-channel transistor 35.

Programming circuit 40 includes inverter 41 which is connected between nodes A and B, and inverters 42–43 which are connected in series between nodes A and C. Node B is connected to the bottom plate of capacitor 44 which preferably has a value of 27.9 picofarads. The top plate of capacitor 45, which also preferably has a value of 27.9 picofarads, is connected to node D. Node C is connected to the top plate of capacitor 45, and the bottom plate of capacitor 45 is connected to node E. The antifuse 46 to be programmed is connected between nodes D and E in programming circuit 40.

In operation, the signal PROGRAM is a logic 0, i.e., 0 volts, whenever the antifuse programming circuit is not activated or when an antifuse is not being programmed. In this circumstance, the output of oscillator 20 remains at a logic one (i.e., $V_{CC}$), the voltage at node B is 0 volts and the voltage at node C is equal to the supply voltage, $V_{CC}$. The logic 0 state of PROGRAM also causes transistor 33 to be enabled, and the voltage across capacitor 44 is charged to $V_{CC}$. The logic 0 state of the signal PROGRAM also causes transistor 35 to be enabled, thereby connecting node E to ground. Since node C is at a voltage equal to $V_{CC}$ (e.g., +5 volts) when PROGRAM is 0, the voltage across capacitor 45 is likewise charged to a voltage of $V_{CC}$.

Figure 2:
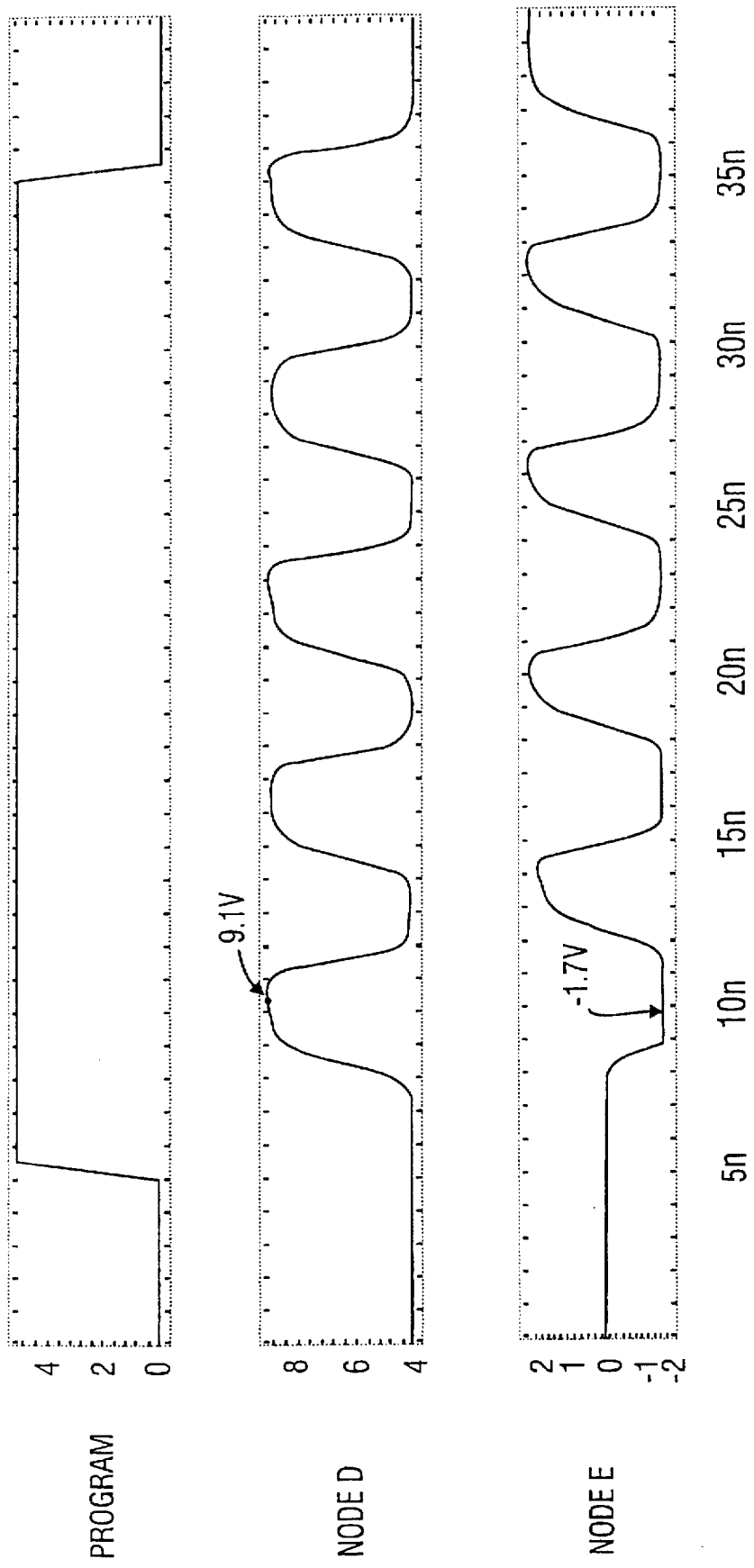
FIG. 2 is a timing diagram which illustrates signals that are generated at various nodes in the circuitry of FIG. 1.

With reference now to FIGS. 1 and 2, when it is desired to program antifuse element 46, the signal PROGRAM is brought to a logic 1. At this time, oscillator 20 is enabled. The voltages at nodes B and C will oscillate between $V_{CC}$ and ground and will be 180° out of phase with one another, since there are two inverters 42, 43 between nodes A and C and only one inverter 41 between nodes A and B. Of course, precharge circuits 30 and 31 are disabled when the signal PROGRAM is a logic 1.

The voltage across capacitor 44 cannot change instantaneously. Thus, as the voltage at node B changes from 0 volts to +5 volts when PROGRAM is a logic 1, the voltage at node D rises to a peak voltage of approximately 2 $V_{CC}$, as shown in FIG. 2. In other words, the voltage at node D will "follow" the voltage at node B. Likewise, the voltage across capacitor 45 cannot change instantaneously, and the voltage at node E will "follow" the voltage at node C. However, if the substrate bias voltage (Vbb) is −1.0 volt, the most negative voltage that can be produced at node E is approximately −1.7 volts, as shown in FIG. 2. The maximum difference in voltage between the voltage at node D and the voltage at node E is approximately 10.8 volts. This voltage should be sufficient to program antifuse 46, which is connected between nodes D and E.

Figure 3:
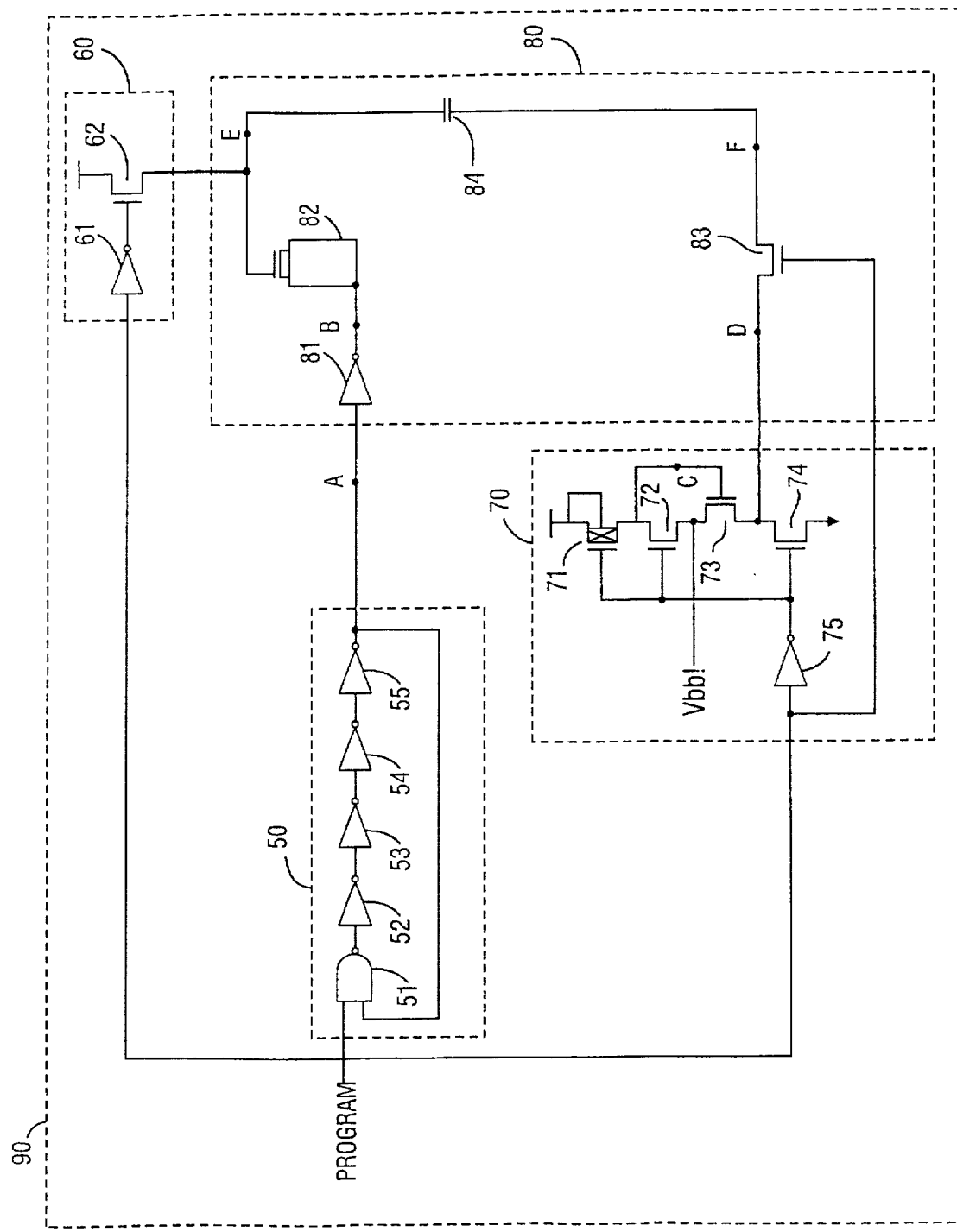
FIG. 3 is an electrical schematic diagram that illustrates another embodiment of a voltage generator in accordance with the present invention.

With reference to FIG. 3, there is illustrated an integrated circuit 90, e.g., a DRAM, containing another embodiment of the voltage generator in accordance with the present invention. This embodiment comprises oscillator 50, precharge circuit 60, negative voltage generator 70 and programming circuit 80, all connected as shown in FIG. 3. Oscillator 50 is preferably a ring oscillator comprising NAND gate 51 and inverters 52–55. Precharge circuit 16 includes inverter 61 and N-channel transistor 62. Negative voltage generator 70 includes P-channel transistor 71, N-channel transistors 72–74 and inverter 75. Programming circuit 80 includes inverter 81, capacitor 82 (which preferably has a value of 27.9 picofarads) and N-channel transistor 83. The antifuse element 84 to be programmed is connected between nodes D and E of programming circuit 80.

In operation, when the signal PROGRAM is a logic 0, the output of oscillator 50 remains at a logic 1 (e.g. +5 volts) and the voltage at node B is 0 volts. The logic 0 state of the signal PROGRAM also causes transistor 62 to be enabled, and the voltage across capacitor 82 is charged to $V_{CC}$.

When the signal PROGRAM is a logic 0, P-channel transistor 71 is off, and N-channel transistor 83 is off. N-channel transistor 72 is on in this circumstance and passes the negative voltage on the Vbb! to node C. In this circumstance, N-channel transistor 73 is turned off, and N-channel transistor 74 is enabled which causes the voltage at node D to be at ground.

Figure 4:
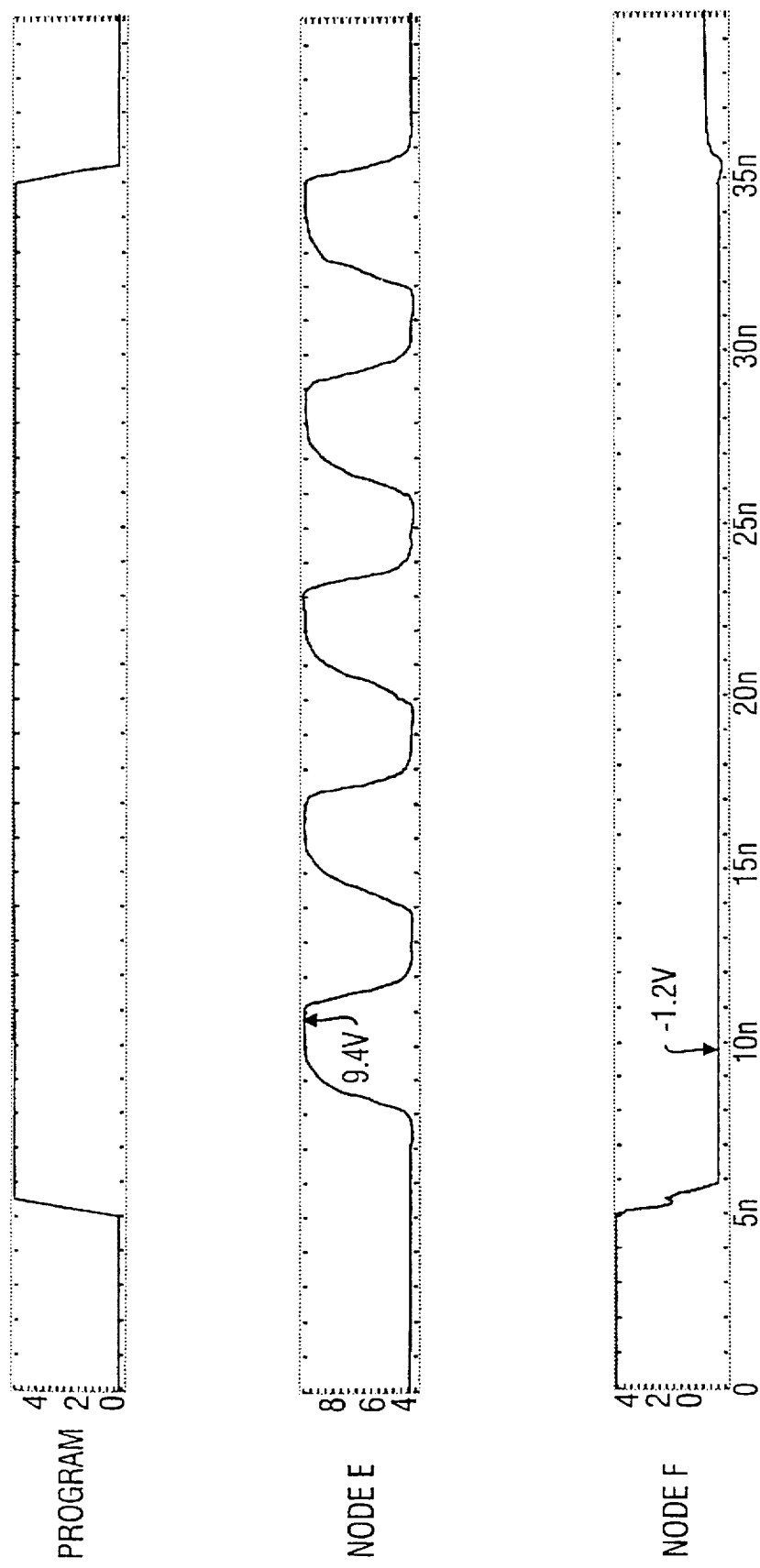
FIG. 4 is a timing diagram which illustrates signals that are generated at various nodes in the circuitry of FIG. 3.

When the antifuse 84 is to be programmed, the PROGRAM signal is brought to a logic 1, i.e., $V_{CC}$ volts. Ring oscillator 50 is enabled and the voltage at node B will begin to oscillate between ground (i.e., 0 volts) and $V_{CC}$. Since the voltage across capacitor 82 cannot change instantaneously, the voltage at node E rises from $V_{CC}$ to a peak voltage of approximately 2 $V_{CC}$, as shown in FIG. 4, as the voltage at node B rises from 0 to $V_{CC}$ volts.

Still referring to FIG. 3, when the signal PROGRAM is equal to $V_{CC}$, the P-channel transistor 71 is turned off and the voltage on node C is pulled to $V_{CC}$. N-channel transistor 73 is on in this circumstance so that the negative voltage Vbb! is passed through N-channel transistor 73 and N-channel transistor 83. The voltage on node F is forced to a negative voltage level, as shown in FIG. 4. Thus, when the signal PROGRAM is a logic 1, a maximum difference in voltage exists between nodes E and F which is sufficient to program antifuse 84.

What is claimed is:

1. Circuitry for generating a voltage to program an antifuse in an integrated circuit, comprising:
   circuitry for producing oscillating voltages at first and second nodes, which voltages are 180° out of phase with one another and have a maximum voltage difference between them that is sufficient to program the antifuse.

2. The apparatus of claim 1, wherein the voltage generator comprises:

first and second capacitors which have top and bottom plates, the top plate of the first capacitor constituting the first node and the bottom plate of the second capacitor constituting the second node;
   circuitry for charging the voltage between the top and bottom plates of the two capacitors to a first voltage;
   circuitry for producing a first oscillating signal at the bottom plate of the first capacitor which oscillates between zero volts and said first voltage; and
   circuitry for producing a second oscillating signal at the top plate of the second capacitor which oscillates between zero volts and said first voltage and which is 180° out of phase with said second oscillating voltage.

3. The apparatus of claim 2, wherein the first voltage is the supply voltage of the integrated circuit.

4. Circuitry for generating a voltage to program an antifuse in a dynamic random access memory, comprising:
   circuitry for producing oscillating voltages at first and second nodes, which voltages are 180° out of phase with one another and have a maximum voltage difference between them that is sufficient to program the antifuse.

5. The apparatus of claim 4, wherein the voltage generator comprises:
   first and second capacitors which have top and bottom plates, the top plate of the first capacitor constituting the first node and the bottom plate of the second capacitor constituting the second node;
   circuitry for charging the voltage between the top and bottom plates of the two capacitors to a first voltage;
   circuitry for producing a first oscillating signal at the bottom plate of the first capacitor which oscillates between zero volts and said first voltage; and
   circuitry for producing a second oscillating signal at the top plate of the second capacitor which oscillates between zero volts and said first voltage and which is 180° out of phase with said second oscillating voltage.

6. The apparatus of claim 5, wherein the first voltage is the supply voltage of the integrated circuit.

7. A dynamic random access memory, comprising:
   at least one antifuse element; and
   circuitry for producing oscillating voltages at first and second nodes, which voltages are 180° out of phase with one another and have a maximum voltage difference between them that is sufficient to program the antifuse.

8. The dynamic random access memory of claim 7, wherein the voltage generator comprises:
   first and second capacitors which have top and bottom plates, the top plate of the first capacitor constituting the first node and the bottom plate of the second capacitor constituting the second node;
   circuitry for charging the voltage between the top and bottom plates of the two capacitors to a first voltage;
   circuitry for producing a first oscillating signal at the bottom plate of the first capacitor which oscillates between zero volts and said first voltage; and
   circuitry for producing a second oscillating signal at the top plate of the second capacitor which oscillates between zero volts and said first voltage and which is 180° out of phase with said second oscillating voltage.

9. The dynamic random access memory of claim 8, wherein the first voltage is the supply voltage of the memory.

10. Circuitry for generating a voltage to program an antifuse in an integrated circuit, comprising:

circuitry for producing an oscillating voltage at a first node and for producing a negative voltage at a second node, the voltages at the first and second nodes having a maximum voltage difference between them that is sufficient to program the antifuse.

11. The apparatus of claim 10, wherein the voltage generator comprises:

a capacitor which has a top plate and a bottom plate, the top plate of the capacitor constituting the first node;

circuitry for charging the voltage between the top and bottom plates of the capacitor to a first voltage; and circuitry for producing a first oscillating signal at the bottom plate of the capacitor which oscillates between zero volts and said first voltage.

12. The apparatus of claim 11, wherein the first voltage is the supply voltage of the integrated circuit.

13. Circuitry for generating a voltage to program an antifuse in a dynamic random access memory, comprising:

circuitry for producing an oscillating voltage at a first node and for producing a negative voltage at a second node, the voltages at the first and second nodes having a maximum voltage difference between them that is sufficient to program the antifuse.

14. The apparatus of claim 13, wherein the voltage generator comprises:

a capacitor which has a top plate and a bottom plate, the top plate of the capacitor constituting the first node;

circuitry for charging the voltage between the top and bottom plates of the capacitor to a first voltage; and circuitry for producing a first oscillating signal at the bottom plate of the first capacitor which oscillates between zero volts and said first voltage.

15. The apparatus of claim 14, wherein the first voltage is the supply voltage of the integrated circuit.

16. A dynamic random access memory, comprising:

at least one antifuse element; and circuitry for producing an oscillating voltage at a first node and for producing a negative voltage at a second node, the voltages at the first and second nodes having a maximum voltage difference between them that is sufficient to program the antifuse.

17. The dynamic random access memory of claim 16, wherein the voltage generator comprises:

a capacitor having a top plate and a bottom plate, the top plate of the capacitor constituting the first node;

circuitry for charging the voltage between the top and bottom plates of the capacitors to a first voltage; and circuitry for producing a first oscillating signal at the bottom plate of the capacitor which oscillates between zero volts and said first voltage.

18. The dynamic random access memory of claim 17, wherein the first voltage is the supply voltage of the memory.

* * * * *